US007168056B2

(12) United States Patent
Dong

(10) Patent No.: US 7,168,056 B2
(45) Date of Patent: *Jan. 23, 2007

(54) SYSTEM AND METHOD FOR VERIFYING TRACE DISTANCES OF A PCB LAYOUT

(75) Inventor: Hua Dong, Shenzhen (CN)

(73) Assignees: Hong Fu Jin Precision Industry (Shenzhen) Co., Ltd. (CN); Hon Hai Precision Industry Co., Ltd. (TW)

( * ) Notice: Subject to any disclaimer, the term of this patent is extended or adjusted under 35 U.S.C. 154(b) by 298 days.

This patent is subject to a terminal disclaimer.

(21) Appl. No.: 10/977,982

(22) Filed: Oct. 29, 2004

(65) Prior Publication Data

US 2005/0257182 A1   Nov. 17, 2005

(30) Foreign Application Priority Data

May 14, 2004   (TW) .............................. 93113623 A

(51) Int. Cl.
*G06F 17/50* (2006.01)
(52) U.S. Cl. .......................................... 716/5; 716/15
(58) Field of Classification Search .................... None
See application file for complete search history.

(56) References Cited

U.S. PATENT DOCUMENTS

| | | | | |
|---|---|---|---|---|
| 5,247,455 A | * | 9/1993 | Yoshikawa ................... | 716/15 |
| 5,383,132 A | * | 1/1995 | Shinohara et al. ............. | 716/5 |
| 6,316,944 B1 | | 11/2001 | Barnette et al. ............. | 324/617 |
| 6,718,529 B1 | | 4/2004 | Iwanishi ........................ | 716/6 |
| 6,799,306 B2 | * | 9/2004 | Araki et al. ................... | 716/4 |
| 7,117,459 B2 | * | 10/2006 | Tanimoto et al. ............. | 716/4 |

* cited by examiner

*Primary Examiner*—Leigh M. Garbowski
(74) *Attorney, Agent, or Firm*—Morris Manning & Martin LLP; Tim Tingkang Xia, Esq.

(57) ABSTRACT

A system for verifying trace distances of a PCB layout includes a computer (10) and a database (11). The computer includes: a segment receiving module (100) for receiving segments of a selected trace, and depositing the segments in a segment set; a segment selecting module (101) for selecting an unverified segment from the segment set; a distance setting module (102) for setting a searching distance; an area ascertaining module (103) for ascertaining a rectangular area; a segment searching module (104) for searching segments of other traces in the rectangular area; a distance calculating module (105) for calculating a distance between the unverified segment and each searched segment; a distance comparing module (106) for comparing the calculated distances to obtain a shortest distance, and comparing the shortest distance with a preset benchmark distance; and a verification determining module (107) for determining whether all segments of the selected trace has been verified.

12 Claims, 3 Drawing Sheets

SYSTEM AND METHOD FOR VERIFYING TRACE DISTANCES OF A PCB LAYOUT

BACKGROUND OF THE INVENTION

1. Field of the Invention

The present invention relates to computer-enabled distance verifying systems and methods, and particularly to a system and method for verifying trace distances of a printed circuit board (PCB) layout.

2. Background of the Invention

Computer chip sizes are continuing to be miniaturized, and electrical signals are being clocked at ever increasing frequencies. Even more that previously, high-speed, high-frequency signals being driven between chips via traces on a PCB are liable to detrimental impedance effects. One manifestation of these impedance effects is unwanted reflections due to impedance mismatches. The high-speed, high-frequency signals may also be prone to cross-talk and electromagnetic interference (EMI).

EMI is an electrical disturbance in an electronics-based system. EMI can be caused by natural phenomena such as lightning, by low-frequency waves emitted from electromechanical devices such as motors, or by high-frequency waves emitted from integrated circuits and other electronic devices such as routers. In the United States, the Federal Communications Commission sets limits on the EMI output of electronic devices. Other countries set their own limits on the EMI output of electronic devices. It is therefore necessary for all parties involved in the fabrication, manufacture, and/or sale of electronic devices to comply with the limitations imposed. In particular, it is necessary for manufacturers to ensure that EMI emissions of electronic devices in use are at or below the maximums imposed in particular jurisdictions.

The distance between two adjacent traces on a PCB is a parameter affecting EMI emissions. In particular, the shorter the distance between adjacent traces, the more intense the EMI emissions are. That is, the EMI emission is inversely proportional to the distance. Therefore, when constructing a PCB layout, it is necessary to verify the distance between each two adjacent traces to insure that the EMI emissions caused by the traces meet the requirements imposed in the relevant jurisdiction(s). Additionally, such verification should be performed before the final physical layout of the PCB is determined, in order to avoid or minimize the difficult and expensive process of rectifying failed distances.

Accordingly, there is a need for a system and method for verifying distances between adjacent traces of a PCB layout, in which verification is fast and inexpensive, and can be performed as early as possible in the design process.

SUMMARY OF THE INIVENTION

A main objective of the present invention is to provide a system and method which can efficiently verify trace distances of a PCB layout.

To accomplish the above objective, a system for verifying trace distances of a PCB layout in accordance with a preferred embodiment of the present invention comprises: a database for storing information on traces of the PCB layout; and a computer which is connected to the database, for calculating and verifying a shortest distance. The computer comprises a segment receiving module, a segment selecting module, a distance setting module, an area ascertaining module, a segment searching module, a distance calculating module, a distance comparing module, and a verification determining module.

The segment receiving module is for receiving segments of a selected trace from the database, and depositing the segments in a segment set. The segment selecting module is for selecting an unverified segment from the segment set. The distance setting module is for setting a searching distance based on a preset distance parameter and a searching time. The area ascertaining module is for ascertaining a rectangular area to cover the unverified segment according to a basic rectangle and the searching distance. The segment searching module is for searching segments of other traces in the rectangular area according to a segment type of the unverified segment. The distance calculating module is for calculating a distance between the unverified segment and each searched segment. The distance comparing module is for comparing the distances to obtain a shortest distance, and comparing the shortest distance with a preset benchmark distance. The verification determining module is for determining whether all segments of the selected trace have been verified.

Further, the present invention provides a method for verifying trace distances of a PCB layout, the method comprising the steps of: (a) receiving segments of a selected trace from the database, and depositing the segments in a segment set; (b) selecting an unverified segment from the segment set; (c) setting a searching distance based on a preset distance parameter and a searching time; (d) ascertaining a rectangular area according to the searching distance; (e) searching segments of other traces in the rectangular area; (g) determining whether there are any segments of other traces in the rectangular area; (g) calculating a distance between the unverified segment and each searched segment; (h) comparing the distances to obtain a shortest distance; (i) comparing the shortest distance with a preset benchmark distance; and (j) annotating DRC information if the shortest distance is not more than the preset benchmark distance.

Other objects, advantages and novel features of the present invention will be drawn from the following detailed description with reference to the attached drawings, in which:

DETAILED DESCRIPTION OF THE INVENTION

Figure 1:
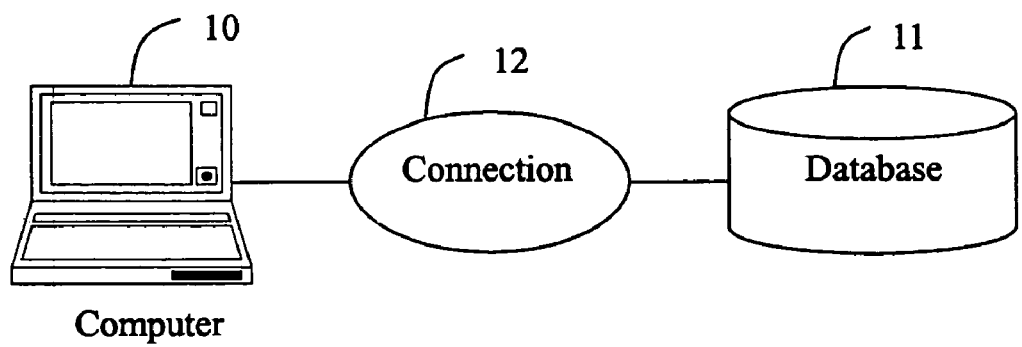
FIG. 1 is a schematic diagram of hardware infrastructure of a system for verifying trace distances of a PCB layout in accordance with the preferred embodiment of the present invention.

FIG. 1 is a schematic diagram of hardware infrastructure of a system for verifying trace distances of a printed circuit board (PCB) layout (hereinafter, "the system") in accordance with the preferred embodiment of the present invention. The system comprises a computer 10, a database 11, and a connection 12. The computer 10, which contains a plurality of function modules installed therein, calculates and verifies a shortest distance regarding a selected trace in a set rectangular area to determine whether the PCB layout is satisfactory. The database 11 stores information on traces of the PCB layout. The information includes trace IDs, segments of each trace, segment IDs, a basic rectangle for each segment, and a type of each segment. A basic rectangle is a minimum rectangular area which exactly encloses a corresponding segment. The segment type may be either a line or an arc. The connection 12 is a database connectivity such as an open database connectivity (ODBC) or a Java database connectivity (JDBC), and connects the computer 10 to the database 11.

Figure 2:
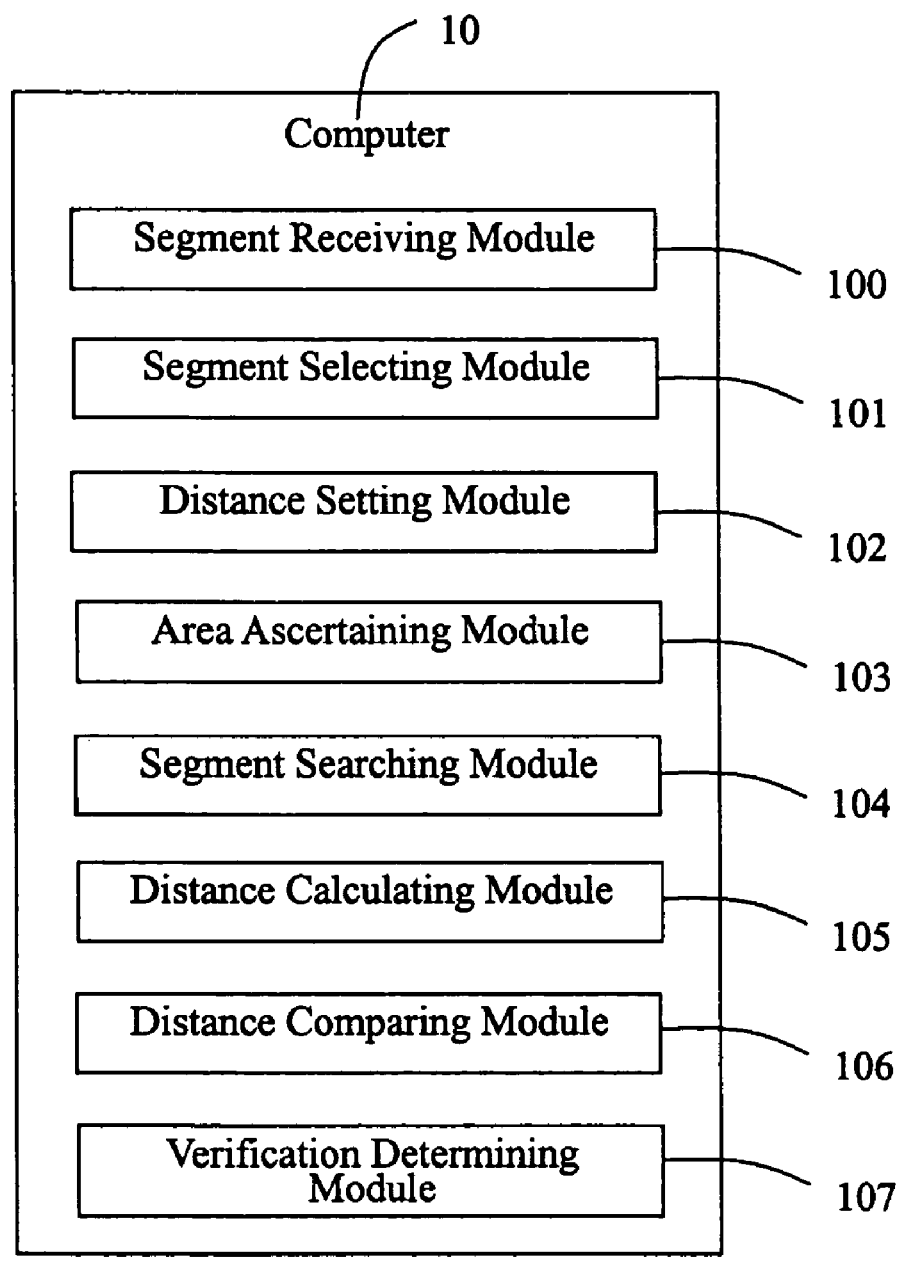
FIG. 2 is a schematic diagram of main function modules of a computer of the system of FIG. 1.

FIG. 2 is a schematic diagram of main function modules of the computer 10. The computer 10 comprises a segment receiving module 100, a segment selecting module 101, a distance setting module 102, an area ascertaining module 103, a segment searching module 104, a distance calculating module 105, a distance comparing module 106, and a verification determining module 107. The segment receiving module 100 receives all segments contained in a selected trace, and deposits the segments in a segment set from which the segments are to be read for verification one by one. The segment selecting module 101 selects an unverified segment from the segment set when each verification begins. The distance setting module 102 sets a searching distance D for the unverified segment according to the formula: D=A+10*n, wherein A is a preset distance parameter, and n is a searching time. The area ascertaining module 103 ascertains a rectangular area to cover the unverified segment, based on a basic rectangle of the unverified segment and the searching distance D. The segment searching module 104 searches segments of other traces in the rectangular area, according to a segment type of the unverified segment. The distance calculating module 105 calculates a distance between the unverified segment and each searched segment. The distance comparing module 106 compares the calculated distances to obtain a shortest distance $D_S$, and compares the shortest distance $D_S$ with a preset benchmark distance $D_P$. The verification determining module 107 determines whether all segments of the selected trace have been verified.

Figure 3:
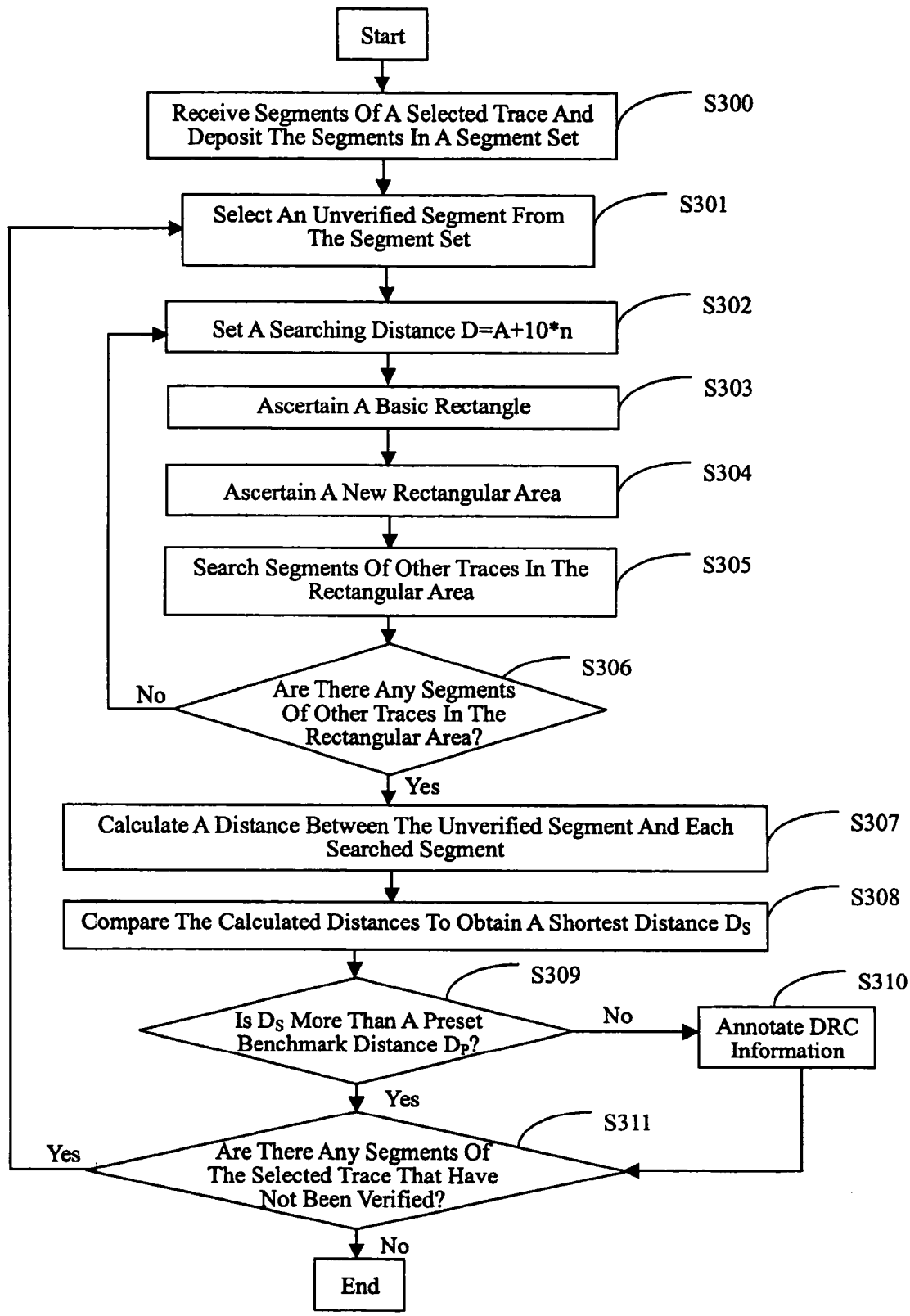
FIG. 3 is a flowchart of a preferred method for implementing the system of FIG. 1.

FIG. 3 is a flowchart of a preferred method for implementing the system. In step S300, the segment receiving module 100 receives segments of a selected trace from the database 11, and deposits the segments in a segment set. In step S301, the segment selecting module 101 selects an unverified segment from the segment set based on a selection function, such as an Allegro™ selection function. Allegro is a PCB design software tool with a strong function library, and is available from Cadence Design Systems Inc. In step S302, the distance setting module 102 sets a searching distance D for the unverified segment according to the formula: D=A+10*n, wherein A is a preset distance parameter, and n is a searching time. In step S303, the area ascertaining module 103 ascertains a basic rectangle to exactly cover the selected unverified segment. In step S304, the area ascertaining module 103 extends the basic rectangle in length and width to obtain a new larger rectangle according to the searching distance D. In step S305, the segment searching module 104 searches segments of other traces in the new rectangular area based on a searching function, such as the Allegro searching function. The searching function adopts different algorithms to search segments of other traces in the rectangular area and generates different results, according to different segment types of selected unverified segments. That is, the searching function adopts one algorithm when the selected unverified segment is a line, and adopts another algorithm when the selected unverified segment is an arc. In step S306, the segment searching module 104 determines whether there are any segments of other traces in the rectangular area. If there are no segments of other traces in the rectangular area, the procedure returns to step S302 described above.

In contrast, if there are segments of other traces in the rectangular area, in step S307, the distance calculating module 105 adopts a particular calculating function to calculate a distance between the selected unverified segment and each searched segment, according to the segment types of both the selected unverified segment and the searched segment. For example: when both the selected unverified segment and the searched segment are lines, the calculating function is a function1 symbolically depicted as grs_lib_lineToline( ); when both the selected unverified segment and the searched segment are arcs, the calculating function is a function2 symbolically depicted as grs_lib_arcToarc( ); when the selected unverified segment is a line and the searched segment is an arc, the calculating function is a function3 symbolically depicted as grs_lib_lineToarc( ); and when the selected unverified segment is an arc and the searched segment is a line, the calculating function is a function4 symbolically depicted as grs_lib_arcToline( ). In step S308, the distance comparing module 106 compares the calculated distances to obtain a shortest distance $D_S$. In step S309, the distance comparing module 106 compares the shortest distance $D_S$ with a preset benchmark distance $D_P$. If the shortest distance $D_S$ is more than the preset benchmark distance $D_P$, the procedure goes directly to step S311 described below. If the shortest distance $D_S$ is not more than the preset benchmark distance $D_P$, in step S310, the distance comparing module 106 annotates design rule check (DRC) information to indicate that the selected segment of the selected trace does not meet corresponding design requirements, whereupon the procedure goes to step S311.

In step S311, the verification determining module 107 determines whether there are any segments of the selected trace that have not been verified. If there are any segments of the selected trace that have not been verified, the procedure returns to step S301 described above. If all segments of the trace have been verified, the procedure is finished.

Although the present invention has been specifically described on the basis of a preferred embodiment and preferred method, the invention is not to be construed as being limited thereto. Various changes or modifications may be made to the embodiment and methods without departing from the scope and spirit of the invention.

What is claimed is:

1. A system for verifying trace distances of a printed circuit board (PCB) layout, comprising:

a database for storing information on traces of the PCB layout;

a computer, which is connected to the database, for calculating and verifying a shortest distance, the computer comprising:

a segment receiving module for receiving segments contained in a selected trace from the database, and depositing the segments in a segment set;

a segment selecting module for selecting an unverified segment from the segment set when each of verifications begins;

a distance setting module for setting a searching distance for the unverified segment based on a preset distance parameter and a searching time;

an area ascertaining module for ascertaining a rectangular area to cover the unverified segment based on a basic rectangle and the searching distance;

segment searching module for searching any segments of other traces in the rectangular area according to a segment type of the unverified segment;

a distance calculating module for calculating a distance between the unverified segment and each searched segment;

a distance comparing module for comparing the calculated distances to obtain a shortest distance, and comparing the shortest distance with a preset benchmark distance; and a verification determining module for determining whether all segments of the selected trace have been verified.

2. The system for verifying trace distances of a PCB layout according to claim 1, wherein the basic rectangle is a minimum rectangle which exactly covers the unverified segment.

3. The system for verifying trace distances of a PCB layout according to claim 1, wherein the distance comparing module is further for annotating design rule check (DRC) information, if the shortest distance is not more than the preset benchmark distance.

4. A computer-based method for verifying trace distances of a printed circuit board (PCB) layout, the method comprising the steps of:

receiving segments of a selected trace from a database, and depositing the segments in a segment set;

selecting an unverified segment from the segment set;

setting a searching distance based on a preset distance parameter and a searching time;

ascertaining a rectangular area according to the searching distance;

searching segments of other traces in the rectangular area;

determining whether there are any segments of other traces in the rectangular area;

calculating a distance between the unverified segment and each searched segment, if there are segments of other traces in the rectangular area;

comparing all calculated distances to obtain a shortest distance;

comparing the shortest distance with a preset benchmark distance; and annotating design rule check (DRC) information if the shortest distance is not more than the preset benchmark distance.

5. The method according to claim 4, wherein the DRC annotation indicates that the selected segment of the selected trace does not meet design requirements.

6. The method according to claim 4, further comprising the step of: determining whether there are any segments of the selected trace that have not been verified.

7. The method according to claim 6, further comprising the step of: returning to the step of selecting an unverified segment from the segment set, if there are any segments of the selected trace that have not been verified.

8. The method according to claim 4, wherein the step of determining whether there are any segments of other traces in the rectangular area comprises the step of: returning to the step of setting a searching distance, if there are no segments of other traces in the rectangular area.

9. A method for verifying spacing distance information of neighboring traces of a circuit layout, the method comprising the steps of:

providing segment information of a selected one of said neighboring traces;

calculating a searching distance based on a value of elapsing time of practicing said method;

forming a searching area enlarged from a selected segment of said segment information by means of said searching distance;

detecting any other of said neighboring traces in said searching area;

recalculating said searching distance in case of failure of detecting said other of said neighboring traces in said searching area and repeating said forming and detecting steps; and retrieving said distance information between said selected segment and said other of said neighboring traces.

10. The method according to claim 9, further comprising the step of identifying qualification of said distance information and marking any selected segment with disqualified distance information.

11. The method according to claim 9, wherein said selected segment is enclosed by a basic rectangle and said searching area is enlarged from said basic rectangle by means of said searching distance.

12. The method according to claim 9, wherein said searching distance is calculated based on a preset distance parameter plus a multiple of said value of said elapsing time.

* * * * *